(12) United States Patent
Ikemoto et al.

(10) Patent No.: US 8,119,018 B2
(45) Date of Patent: Feb. 21, 2012

(54) MAGNETORESISTIVE EFFECT ELEMENT MANUFACTURING METHOD AND MULTI-CHAMBER APPARATUS FOR MANUFACTURING MAGNETORESISTIVE EFFECT ELEMENT

(75) Inventors: Manabu Ikemoto, Sagamihara (JP); Tomoaki Osada, Fuchu (JP); Naoaki Yokokawa, Hamura (JP)

(73) Assignee: Canon Anelva Corporation, Tokyo (JP)

( * ) Notice: Subject to any disclaimer, the term of this patent is extended or adjusted under 35 U.S.C. 154(b) by 357 days.

(21) Appl. No.: 12/441,098

(22) PCT Filed: Sep. 12, 2007

(86) PCT No.: PCT/JP2007/067754
§ 371 (c)(1),
(2), (4) Date: Mar. 12, 2009

(87) PCT Pub. No.: WO2008/032745
PCT Pub. Date: Mar. 20, 2008

(65) Prior Publication Data
US 2009/0314740 A1    Dec. 24, 2009

(30) Foreign Application Priority Data

Sep. 13, 2006 (JP) ................. 2006-248518

(51) Int. Cl.
*B44C 1/22* (2006.01)
*C03C 15/00* (2006.01)
*C03C 25/68* (2006.01)
*H01L 21/302* (2006.01)
*H01L 21/461* (2006.01)

(52) U.S. Cl. .............. 216/22; 216/58; 216/67; 438/706; 438/710

(58) Field of Classification Search .................... 216/22, 216/58, 63, 67, 74; 438/706, 710
See application file for complete search history.

(56) References Cited

U.S. PATENT DOCUMENTS

| 6,482,329 | B1 | 11/2002 | Takahashi et al. ............... 216/22 |
| 7,060,194 | B2* | 6/2006 | Kodaira et al. .................. 216/22 |
| 2001/0042512 | A1 | 11/2001 | Xu et al. |
| 2002/0064595 | A1 | 5/2002 | Nomura et al. |
| 2003/0080088 | A1 | 5/2003 | Kagami et al. |
| 2003/0118748 | A1 | 6/2003 | Kumagai et al. |

(Continued)

FOREIGN PATENT DOCUMENTS

EP    1926158    5/2008

(Continued)

OTHER PUBLICATIONS

English Translation of International Preliminary Report on Patentability Chapter II for PCT/JP2007/067754 from May 6, 2009.*

(Continued)

*Primary Examiner* — Parviz Hassanzadeh
*Assistant Examiner* — Margaret D Klunk
(74) *Attorney, Agent, or Firm* — Fitzpatrick, Cella, Harper & Scinto

(57) ABSTRACT

A magnetoresistive effect element manufacturing method includes a first step of preparing a magnetoresistive effect element including a magnetic film and a substrate, a second step of etching a predetermined region of the magnetic film by a reactive ion etching method, and a third step of exposing the magnetic film having undergone the second step to a plasma at an ion current density of $4\times10^{-7}$ A/cm$^2$ or less.

7 Claims, 9 Drawing Sheets

U.S. PATENT DOCUMENTS

| | | |
|---|---|---|
| 2004/0175510 A1 | 9/2004 | Hattori et al. |
| 2004/0191426 A1 | 9/2004 | Kumagai et al. |
| 2004/0244684 A1 | 12/2004 | Tsunoda et al. |
| 2005/0016957 A1 | 1/2005 | Kodaira et al. |
| 2005/0020011 A1 | 1/2005 | Nakajima et al. |
| 2005/0217576 A1 | 10/2005 | Ishibashi et al. |
| 2006/0027166 A1 | 2/2006 | Kumagai |
| 2008/0000551 A1 | 1/2008 | Sato et al. |
| 2008/0017500 A1 | 1/2008 | Tanaka et al. |
| 2008/0276957 A1 | 11/2008 | Nogami |
| 2009/0078569 A1 | 3/2009 | Hirayanagi et al. ..... 204/298.01 |

FOREIGN PATENT DOCUMENTS

| | | |
|---|---|---|
| JP | 2000-345349 | 12/2000 |
| JP | 2002-83806 | 3/2002 |
| JP | 2002-167661 | 6/2002 |
| JP | 2002-212732 | 7/2002 |
| JP | 2002-212736 | 7/2002 |
| JP | 2002-246386 | 8/2002 |
| JP | 2003-197620 | 7/2003 |
| JP | 2003-203313 | 7/2003 |
| JP | 2004-111506 | 4/2004 |
| JP | 2004-235223 | 8/2004 |
| JP | 2004-296638 | 10/2004 |
| JP | 2004-326831 | 11/2004 |
| JP | 2005-42143 | 2/2005 |
| JP | 2005-44848 | 2/2005 |
| JP | 2005-268396 | 9/2005 |
| JP | 2005236144 A * | 9/2005 |
| JP | 2005-277249 | 10/2005 |
| JP | 2005277249 A * | 10/2005 |
| JP | 2006-49544 | 2/2006 |
| JP | 2006-49706 | 2/2006 |
| JP | 2006-156995 | 6/2006 |
| WO | 2007-032379 | 3/2007 |

OTHER PUBLICATIONS

International Search Report dated Dec. 4, 2007 in PCT/JP2007/067754.

Russian Decision on Grant dated Jan. 19, 2010 in corresponding Russian Patent Application No. 2009113610/28(018600), and English-language translation thereof.

* cited by examiner

MAGNETORESISTIVE EFFECT ELEMENT MANUFACTURING METHOD AND MULTI-CHAMBER APPARATUS FOR MANUFACTURING MAGNETORESISTIVE EFFECT ELEMENT

TECHNICAL FIELD

The present invention relates to a method of manufacturing a magnetoresistive effect element for use in an MRAM (Magnetic Random Access Memory) as an integrated magnetic memory or in a thin-film magnetic head, and a multi-chamber apparatus for manufacturing the magnetoresistive effect element.

BACKGROUND ART

An MRAM as an integrated magnetic memory is attracting attention as an unlimitedly programmable memory having an integrating density equal to that of a DRAM and a high speed equal to that of an SRAM. Also, the development of a thin-film magnetic head, magnetic sensor, and the like using magnetoresistive effect elements such as a GMR (Giant Magnetic Resistance) element and TMR (Tunneling Magnetic Resistance) element is rapidly progressing.

In an example of the magnetoresistive effect elements, a lower electrode is formed on a substrate made of, for example, silicon or glass, and a multilayered film having eight layers forming a magnetoresistive effect element (TMR) is formed on the lower electrode. An example of this multilayered film having eight layers is formed by sequentially stacking a PtMn layer as an antiferromagnetic layer, a magnetization fixed layer (Pinned Layer, Ru, pinned Layer), an insulating layer (Barrier Layer), a free layer, and a protective layer (hard mask) on a Ta layer as the lowermost underlying layer.

Methods have been proposed to obtain necessary performance of a magnetoresistive effect element by processing a substrate having a multilayered magnetic film forming the element by thin-film processing techniques such as reactive ion etching (RIE) and ion beam etching (IBE) developed in the semiconductor industry (see patent references 1 to 3).

As a processing technique using reactive ion etching among these techniques, the present applicant has proposed a method using alcohol (e.g., methanol) having at least one hydroxyl group as an etching gas. This method achieves the effects of increasing the etching rate and reducing damage mainly caused by oxidation after etching, compared to the conventional method using carbon monoxide gas to which ammonia gas is added (patent reference 3).

The present applicant has also proposed apparatuses in which a plasma generation chamber for generating a plasma and a substrate processing chamber for loading and processing a substrate are partitioned by a partition plate having a plurality of through holes, the plasma generation chamber generates a radical, and the substrate surface is processed by the radical having passed through the partition plate (patent references 4 to 13).

Patent reference 1: Japanese Patent Laid-Open No. 2003-203313
Patent reference 2: Japanese Patent Laid-Open No. 2004-326831
Patent reference 3: Japanese Patent Laid-Open No. 2005-42143
Patent reference 4: Japanese Patent Laid-Open No. 2000-345349
Patent reference 5: Japanese Patent Laid-Open No. 2002-83806
Patent reference 6: Japanese Patent Laid-Open No. 2002-212732
Patent reference 7: Japanese Patent Laid-Open No. 2002-212736
Patent reference 8: Japanese Patent Laid-Open No. 2002-246386
Patent reference 9: Japanese Patent Laid-Open No. 2003-197620
Patent reference 10: Japanese Patent Laid-Open No. 2004-111506
Patent reference 11: Japanese Patent Laid-Open No. 2004-296638
Patent reference 12: Japanese Patent Laid-Open No. 2005-268396
Patent reference 13: Japanese Patent Laid-Open No. 2006-49544

DISCLOSURE OF INVENTION

Problems that the Invention is to Solve

Generally, when processing a magnetoresistive effect element by using reactive ion etching or the like in the manufacture of the element, the surface of a processed multilayered magnetic film is sometimes damaged.

If this damage occurs, the degree of deterioration caused by the damage of the damaged surface (to be referred to as a "damaged layer" hereinafter) on the multilayered magnetic film changes with time when the magnetoresistive effect element is, for example, left to stand in the air, cleaned, and annealed in the manufacturing steps of the element after that. The magnetic characteristics of this damaged layer change with time and affect spins that produce the magnetoresistive effect in the multilayered magnetic film.

In an MRAM, for example, data is read out by spins in the free layer forming the multilayered magnetic film. If the magnetic characteristics vary due to damage occurring during processing such as RIE, the MRAM causes an operation error. Large-capacity integration of an MRAM is difficult because the variations in spins in the free layer forming the multilayered magnetic film are large.

It is, therefore, an object of the present invention to provide a manufacturing method capable of preventing deterioration of the magnetic characteristics of a multilayered magnetic film having a damaged layer, and manufacturing a high-quality magnetoresistive effect element, and a multi-chamber apparatus for manufacturing the magnetoresistive effect element.

Means of Solving the Problems

A magnetoresistive effect element manufacturing method according to the present invention is characterized by including a first step of preparing a magnetoresistive effect element including a magnetic film and a substrate, a second step of etching a predetermined region of the magnetic film by a reactive ion etching method, and a third step of exposing the magnetic film having undergone the second step to a plasma at an ion current density of $4 \times 10^{-7}$ A/cm$^2$ or less.

Alternatively, a magnetoresistive effect element manufacturing method according to the present invention is characterized by including a first step of preparing a magnetoresistive effect element including a magnetic film and a substrate, a second step of forming a hard mask on the magnetoresistive effect element, a third step of etching the magnetic film using a reactive ion etching method by using the hard mask as a mask, and a fourth step of exposing the magnetic film having undergone the third step to a plasma at an ion current density of $4\times10^{-7}$ A/cm$^2$ or less.

Alternatively, a multi-chamber apparatus according to the present invention includes: a sputtering apparatus including a first chamber and a first evacuating means for evacuating the first chamber; a first substrate holder for holding a substrate, a target holder for holding a target, a first cathode electrode, and a first gas supply means for supplying a gas into the first chamber; a processing apparatus including a second chamber, a second evacuating means for evacuating the second chamber, a member which separates an internal space of the second chamber into at least a first sub space and a second sub space, and which has fine holes connecting the first sub space and the second sub space; a second substrate holder installed in the first sub space to hold a substrate; a second gas supply means for supplying a gas to a second cathode electrode installed in the second sub space and to the second sub space; and control means, included in the processing apparatus, for controlling a gas supply amount (with a possible range of 50 to 3,000 sccm, and a more favorable range of 200 to 1,000 sccm) of the second gas supply means, controlling a power supply amount (with a possible range of 100 to 3,000 W, and a more favorable range of 200 to 2,000 W) to the second cathode, and an evacuation amount (with a possible range of 1 to 200 Pa, and a more favorable range of 10 to 50 Pa) of the second evacuating means; the chamber including these such that, when a plasma is generated in the second sub space, a plasma in the first sub space has an ion current density of $4\times10^{-7}$ A/cm$^2$ or less.

In an example of a multilayered magnetic film forming a magnetoresistive effect element (TMR), a lower electrode is formed on a substrate made of, for example, silicon or glass, and a multilayered film having eight layers forming the magnetoresistive effect element is formed on the lower electrode. An example of this multilayered film having eight layers is formed by sequentially stacking a PtMn layer as an antiferromagnetic layer, a magnetization fixed layer (Pinned Layer, Ru, Pinned Layer), an insulating layer (Barrier Layer), a free layer, and a protective layer (hard mask) on a Ta layer as the lowermost underlying layer.

The multilayered magnetic film etched by a reactive ion etching method is exposed to a plasma mainly containing a radical and having an ion current density of $4\times10^{-7}$ A/cm$^2$ or less, and a damaged layer made of a surface oxide layer is reduced as it is exposed to the reducing plasma at an ion current density of $4\times10^{-7}$ A/cm$^2$ or less.

By performing the step of exposure to the plasma mainly containing a radical and having an ion current density of $4\times10^{-7}$ A/cm$^2$ or less, a high-quality multilayered magnetic film can be formed by improving the oxidation damaged layer of the multilayered magnetic film produced by reactive ion etching without changing the shape of the damaged layer.

In the magnetoresistive effect element manufacturing method of the present invention, reactive ion etching can be performed by etching the multilayered magnetic film by using the hard mask layer formed on the upper surface of the multilayered magnetic film as a mask, and using alcohol having at least one hydroxyl group as an etching gas.

Reactive ion etching using alcohol (e.g., methanol or ethanol) having at least one hydroxyl group as an etching gas can reduce the damage inflicted to the multilayered magnetic film by reactive ion etching, and can shorten the time required for processing by ion beam etching performed following the processing by reactive ion etching.

It is also possible to use ketones (e.g., methylethylketone, isopropylmethylketone, and methylpropylketone) represented by RCOR' (R or R' is an alkyl group), aldehydes represented by RCOH (R is an alkyl group), carboxylic acids represented by RCOOH (R is an alkyl group), esters represented by RCOOR' (R is an alkyl group), and ethers represented by ROR' (R is an alkyl group).

In addition, hydrocarbons having a methyl group such as methane, ethane, propane, and butane can also be used, and it is more favorable to mix oxygen gas, CO gas, ammonia gas, or $CO_2$ gas in the hydrocarbons.

Furthermore, in both of the magnetoresistive effect element manufacturing methods of the present invention described above, the step of forming the protective film is performed following the step of exposure to the plasma mainly containing a radical and having an ion current density of $4\times10^{-7}$ A/cm$^2$ or less.

The step using the reactive ion etching method and the step of exposure to the plasma mainly containing a radical and having an ion current density of $4\times10^{-7}$ A/cm$^2$ or less described above are executed in a vacuum state without being exposed to the air (to be referred to as "consistent vacuum steps" hereinafter). The consistent vacuum steps can be consistently performed in a vacuum state without being exposed to the air until the end of the afore-mentioned protective film formation step.

Since the consistent vacuum steps described above are used, the protective film can be formed in a clean environment kept in a vacuum state, and the multilayered magnetic film having the damaged layer improved by exposure to the plasma mainly containing a radical and having an ion current density of $4\times10^{-7}$ A/cm$^2$ or less can be kept covered with the protective film.

The vacuum state herein mentioned is preferably a low-pressure state lower than $1.3\times10^{-5}$ Pa, but the vacuum condition (vacuum degree) is not limited.

The radical mentioned herein is a neutral active species having no electric charge, and generated from a reducing gas such as hydrogen or ammonia.

The magnetoresistive effect element is manufactured by a high-frequency, high-pressure sputtering method and sputtering apparatus. The high-frequency, high-pressure sputtering method is a sputtering method performed in a high-frequency region of 1 KHz (inclusive) to 100 MHz (inclusive), and in a vacuum degree region at a high pressure of 1 Pa (inclusive) to 20 Pa (inclusive). In this method, a pulse DC or RF bias may also be applied to the substrate side.

The high-frequency, high-pressure sputtering method increases the coverage on the side surfaces over the entire surface of the substrate by changing the bias to be applied to the substrate side or the pressure conditions of sputtering.

That is, even when the multilayered magnetic film on the substrate is formed into a shape having a recess or projection, the high-frequency, high-pressure sputtering method has high film thickness controllability with respect to the side surface in the recess or the two side surfaces of the projection, and has high film thickness symmetry with respect to the side surface in the recess or the two side surfaces of the projection. To make the most of the characteristics of a hard bias in a magnetoresistive effect element for use in a magnetic head, a projecting portion (a portion corresponding to the gap length of the head) that produces the magnetoresistive effect and a portion forming the hard bias must be insulated by an extremely thin insulating layer, for example, an AlN or $AlO_2$ film. Film formation by the high-frequency, high-pressure sputtering method is advantageous in that it is possible to form a favorable very thin insulating layer or the like having high symmetry on the two side surfaces of the projecting portion.

In the magnetoresistive effect element manufacturing apparatus, a sputtering chamber for forming the multilayered magnetic film by the high-frequency, high-pressure sputtering method and a reactive ion etching chamber for processing the multilayered magnetic film by reactive ion etching are formed to communicate with a vacuum transfer chamber. While maintaining the vacuum state, the substrate can be loaded from the vacuum transfer chamber into the sputtering chamber, unloaded from the sputtering chamber to the vacuum transfer chamber, loaded from the vacuum transfer chamber into the reactive ion etching chamber, and unloaded from the reactive ion etching chamber to the vacuum transfer chamber.

A radical processing chamber for exposing the substrate etched in the reactive ion etching chamber to a plasma mainly containing a radical and having an ion current density of $4\times10^{-7}$ A/cm$^2$ or less is formed to communicate with the vacuum transfer chamber. While maintaining the vacuum state, the substrate unloaded from the reactive ion etching chamber can be loaded into the radical processing chamber via the vacuum transfer chamber, and unloaded from the radical processing camber to the vacuum transfer chamber.

When etching the multilayered magnetic film by using alcohol having at least one hydroxyl group as an etching gas, the thickness of a damaged layer is at most about a few ten Å, even if the damaged layer is formed. This makes it possible to shorten the time of processing for reducing the damaged layer subsequently performed in the radical processing chamber by using the plasma mainly containing a radical and having an ion current density of $4\times10^{-7}$ A/cm$^2$ or less. This processing decreases neither the throughput as the production amount per unit time, nor the production efficiency.

Note that in the magnetoresistive effect element manufacturing apparatus of the present invention described above, it is further possible to form a film formation chamber communicating with the vacuum transfer chamber, and load the substrate unloaded from the radical processing chamber into the film formation chamber via the vacuum transfer chamber while maintaining the vacuum state.

Since the film formation chamber is thus connected while maintaining the vacuum state and the protective film is formed in this chamber, the damaged layer is reduced as it is exposed to the plasma mainly containing a radical and having an ion current density of $4\times10^{-7}$ A/cm$^2$ or less, and subsequently the multilayered magnetic film is covered with the protective film. Accordingly, the multilayered magnetic film can be kept clean.

The afore-mentioned film formation chamber is desirably a film formation chamber using a sputtering method performed under high-frequency, high-pressure conditions, that is, performed in a high-frequency region of 1 KHz (inclusive) to 100 MHz (inclusive), and in a vacuum degree region at a high pressure of 1 Pa (inclusive) to 20 Pa (inclusive). This makes it possible to use the high-frequency, high-pressure sputtering method in consistent vacuum film formation. As described previously, it is possible to use the high-frequency, high-pressure sputtering method that increases the coverage on the two side surfaces of the projecting portion over the entire surface of the substrate by changing the bias to be applied to the substrate side, or the pressure conditions of sputtering.

Another apparatus can perform the two steps described above, that is, the step using the reactive ion etching method and the step of exposure to the plasma mainly containing a radical and having an ion current density of $4\times10^{-7}$ A/cm$^2$ or less in the same radical processing chamber.

In the same radical processing chamber of another apparatus, the afore-mentioned etching gas is supplied in a first step, and subsequently the afore-mentioned reducing gas is supplied in a second step.

In another apparatus, the first and second steps described above can also be performed by moving the substrate into the same chamber. This means a so-called in-line type manufacturing apparatus.

In addition, before the means for etching the multilayered magnetic film forming the magnetoresistive effect element by reactive ion etching is installed, a means for etching the hard mask layer by reactive ion etching by using the photoresist layer of the multilayered magnetic film as a PR mask can also be installed in the afore-mentioned vacuum chamber held in a vacuum.

The step of forming the protective film can also be performed after the step of exposure to the plasma mainly containing a radical and having an ion current density of $4\times10^{-7}$ A/cm$^2$ or less. This protective film formation step can also be performed in the afore-mentioned vacuum chamber held in a vacuum.

In this protective film formation, sputtering is performed under high-frequency, high-pressure conditions, that is, in a high-frequency region of 1 KHz (inclusive) to 100 MHz (inclusive) and in a vacuum degree region at a high pressure of 1 Pa (inclusive) to 20 Pa (inclusive), and it is desirable to be able to use the high-frequency, high-pressure sputtering method in consistent vacuum film formation.

In the magnetoresistive effect element manufacturing method and manufacturing apparatus of the present invention, the damaged layer inevitably formed on the multilayered magnetic film by reactive ion etching due to the properties of the etching gas is reduced without changing the pattern shape by exposing the damaged layer to the plasma mainly containing a radical and having an ion current density of $4\times10^{-7}$ A/cm$^2$ or less. Accordingly, a high-quality magnetoresistive effect element can be manufactured. It is also possible to increase the production efficiency because the yield can be increased by improving the magnetic characteristics.

Furthermore, after the damaged layer is reduced as it is exposed to the plasma mainly containing a radical and having an ion current density of $4\times10^{-7}$ A/cm$^2$ or less, a protective film is subsequently formed on the surface of the damaged layer, and these steps including the protective film formation step are consistently performed in a vacuum state. This makes it possible to form the protective film in a clean ambient maintained in a vacuum state, and keep the substrate surface clean.

Other features and advantages of the present invention will be apparent from the following explanation taken in conjunction with the accompanying drawings. Note that the same reference numerals denote the same or similar parts in the accompanying drawings.

BRIEF DESCRIPTION OF DRAWINGS

The accompanying drawings, which are incorporated in and constitute a part of the specification, illustrate embodiments of the invention and, together with the description, serve to explain the principles of the invention.

BEST MODE FOR CARRYING OUT THE INVENTION

Figure 1:
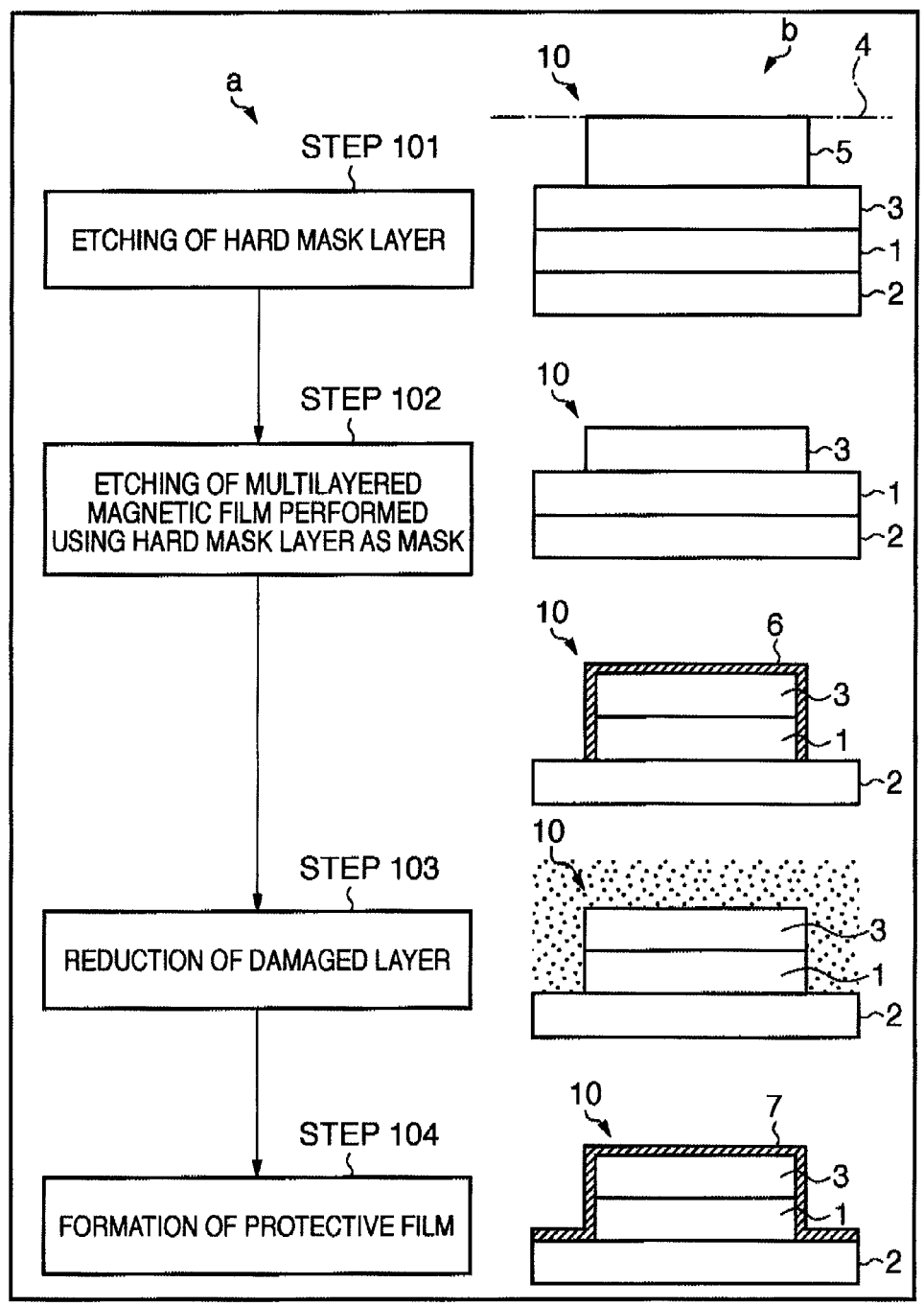
FIG. 1a is a flowchart of a manufacturing method of an embodiment of the present invention.
FIG. 1b is a view showing the sectional structure of a substrate having a multilayered magnetic film forming a magnetoresistive effect element processed in accordance with the flowchart.

FIGS. 1a and 1b are a flowchart (FIG. 1a) showing processing steps of a preferred embodiment of a magnetoresistive effect element manufacturing method of the present invention, and a view (FIG. 1b) corresponding to the flowchart and showing the sectional structure of a substrate 10 having a multilayered magnetic film forming a magnetoresistive effect element ("a substrate 10 having a multilayered magnetic film forming a magnetoresistive effect element" will simply be referred to as "a substrate 10" in some cases hereinafter).

Referring to FIG. 1b, a portion denoted by reference numeral 1 is a multilayered magnetic film. A portion denoted by reference numeral 2 is a layer formed by a substrate 30 and a lower electrode 31 formed on the substrate 30. The multilayered magnetic film 1 is formed on the layer denoted by reference numeral 2. The multilayered magnetic film 1 is made of, for example, a TMR (Tunneling MagnetoResistive effect) multilayered body, a GMR (Giant MagnetoResistive effect) multilayered body having a CPP (Current Perpendicular to Plane) structure, a TMR stack or CPP-structure GMR stack including a bias layer for defining the magnetization direction in a free layer, a CPP-structure GMR multilayered body having an antiferromagnetic coupling type multilayered film, a CPP-structure GMR multilayered body having a specular type spin valve magnetic multilayered film, or a CPP-structure GMR multilayered body having a dual spin valve type multilayered film (to be generally referred to as a multilayered magnetic film hereinafter).

Figure 2:
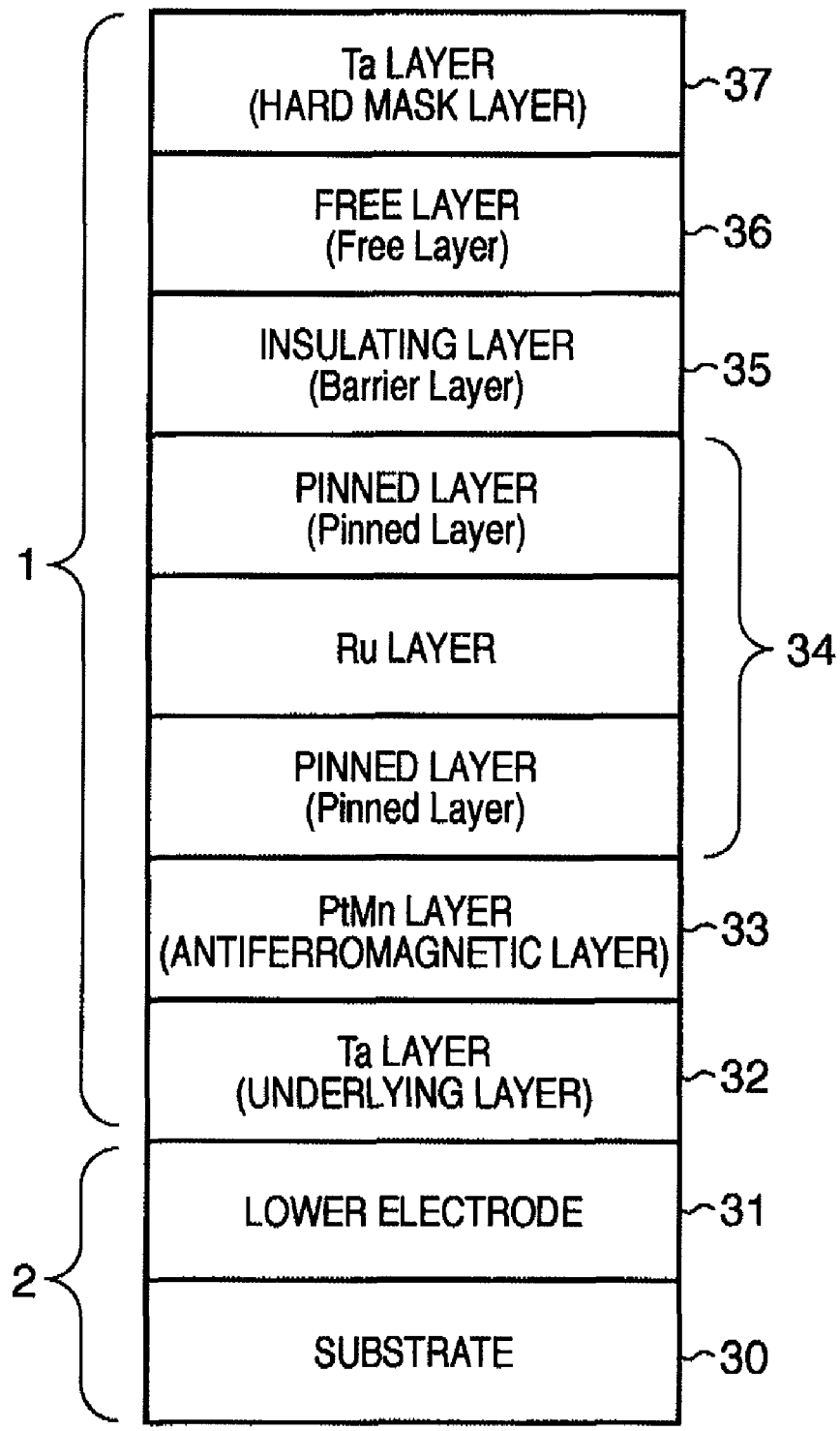
FIG. 2 is a view showing an example of the sectional structure of the substrate having the multilayered magnetic film forming the magnetoresistive effect element.

As shown in FIG. 2, for example, the multilayered magnetic film 1 is obtained by forming a lower electrode 31 on a substrate 30, and forming, atop the lower electrode 31, a multilayered magnetic film, which itself forms a magnetoresistive effect element. In this example shown in FIG. 2, the multilayered magnetic film 1 includes eight layers, and a PtMn layer 33 as an antiferromagnetic layer, a magnetization fixed layer 34 (Pinned Layer, Ru, Pinned Layer), an insulating layer 35 (Barrier Layer), a free layer 36, and a protective layer 37 (hard mask) are sequentially stacked on a Ta layer 32 as the lowermost underlying layer. In the example shown in FIG. 2, the Ru layer in the magnetization fixed layer 34 is 8 A, and the Ta layer 37 as the protective layer (hard mask) is 200 A.

Referring to FIG. 1b, a portion denoted by reference numeral 3 is a hard mask layer. The hard mask layer 3 can be made of a mask material that is a single-layered film or a stacked film of any of Ta (tantalum), Ti (titanium), Al (aluminum), and Si (silicon) as elements, or a mask that is a single-layered film or stacked film of an oxide or nitride of any of Ta, Ti, Al, and Si.

Figure 3:
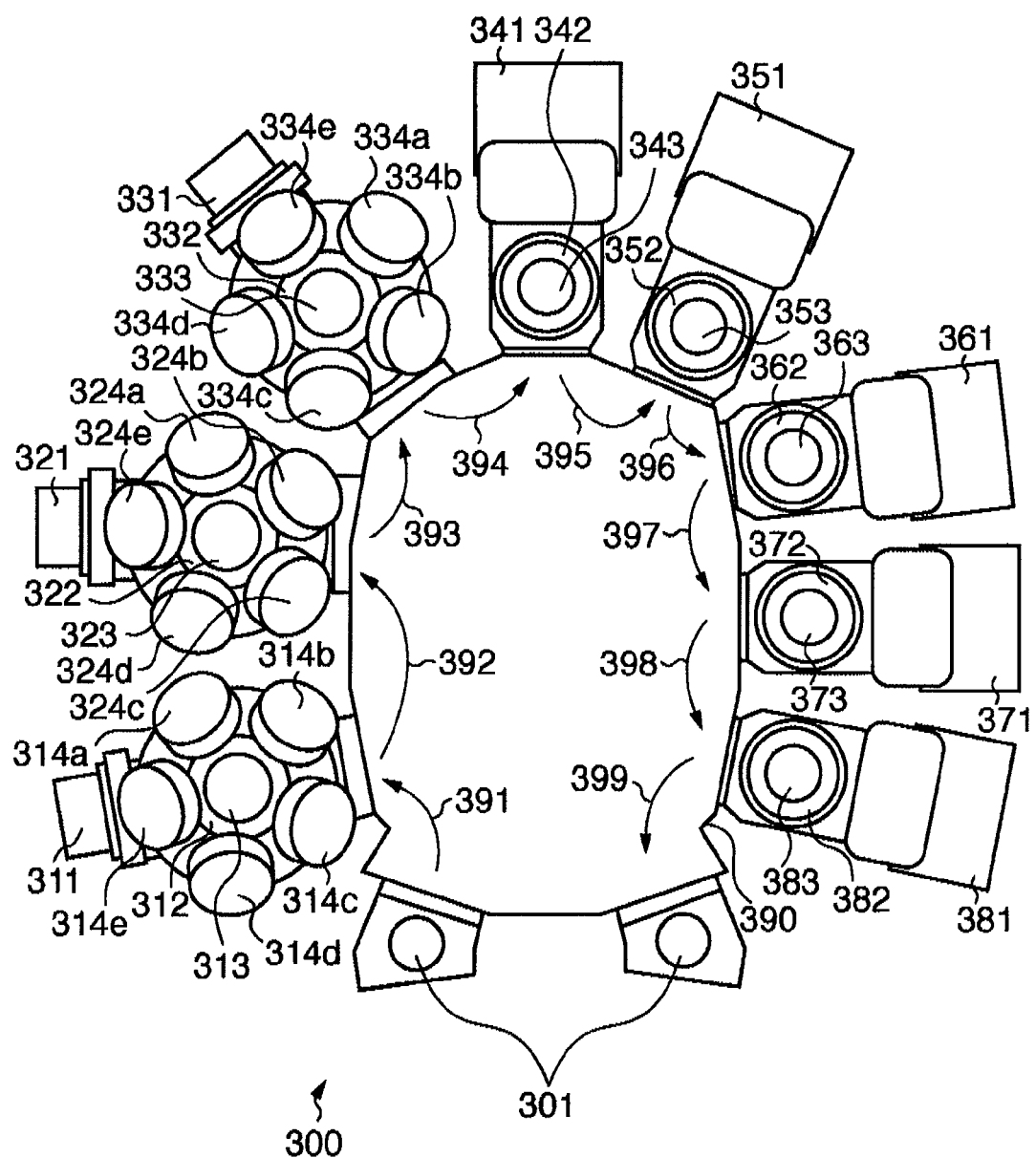
FIG. 3 is a view showing an outline of the arrangement of an example of a magnetoresistive effect element manufacturing apparatus according to the present invention.

FIG. 3 is a view showing the arrangement of a preferred embodiment of a magnetoresistive effect element manufacturing apparatus (multi-chamber apparatus) 300.

In FIG. 3, reference numeral 390 denotes a vacuum transfer chamber. A first sputtering chamber 311, second sputtering chamber 321, third sputtering chamber 331, annealing chamber 341, first reactive ion etching chamber 351, second reactive ion etching chamber 361, radical processing chamber 371, and film formation chamber 381 are connected to the vacuum transfer chamber 390 via shielding means (not shown) such as gate valves so as to communicate with the vacuum transfer chamber 390.

The vacuum transfer chamber 390 also has wafer loaders 301. The wafer loaders 301 can load the substrate 10 into the vacuum transfer chamber 390, and unload the processed substrate from the vacuum transfer chamber 390.

A transfer means (not shown) is installed in the vacuum transfer chamber 390. As indicated by arrows 391 to 399, this transfer means can sequentially transfer the loaded substrate 10 from the first sputtering chamber 311 to the second sputtering chamber 321, from the second sputtering chamber 321 to the third sputtering chamber 331, from the third sputtering chamber 331 to the annealing chamber 341, from the annealing chamber 341 to the first reactive ion etching chamber 351, from the first reactive ion etching chamber 351 to the second reactive ion etching chamber 361, from the second reactive ion etching chamber 361 to the radical processing chamber 371, and from the radical processing chamber 371 to the film formation chamber 381.

Also, the transfer of the substrate 10 indicated by the arrows 391 to 399 in FIG. 3 can consistently be performed in a vacuum state via the vacuum transfer chamber 390 without breaking the vacuum.

That is, the substrate 10 is sequentially transferred from the first sputtering chamber 311 to the second sputtering chamber 321, from the second sputtering chamber 321 to the third sputtering chamber 331, from the third sputtering chamber 331 to the annealing chamber 341, from the annealing chamber 341 to the first reactive ion etching chamber 351, from the first reactive ion etching chamber 351 to the second reactive ion etching chamber 361, from the second reactive ion etching chamber 361 to the radical processing chamber 371, and finally from the radical processing chamber 371 to the film formation chamber 381 in a pure environment, kept in a vacuum state via the vacuum transfer chamber 390. In the film formation chamber 381 in this consistent vacuum ambient, a protective film is formed on the surface on which a damaged layer is reduced in the radical processing chamber 371.

The processed substrate 10 transferred from the film formation chamber 381 as indicated by the arrow 399 is unloaded outside from the vacuum transfer chamber 390 by the wafer loader 301.

In the sputtering chamber 311, Ta, NiFe, PtMn, and CoFe targets 314a, 314b, 314c, and 314d are installed on the ceiling via sputtering cathodes (not shown) against a substrate 313 set on a substrate holder 312 in the center of the bottom of the chamber.

In the second sputtering chamber 321, Ru, CoFe, and Al targets 324a, 324b, and 324c are installed on the ceiling via sputtering cathodes (not shown) against a substrate 323 set on a substrate holder 322 in the center of the bottom of the chamber.

In the sputtering chamber 331, CoFe, NiFe, and Ta targets 334a, 334b, and 334c are installed via sputtering cathodes (not shown) against a substrate 333 set on a substrate holder 332 in the center of the bottom of the chamber.

Ar alone was used as a gas for sputtering in the sputtering film formation chambers 311, 321, and 331.

The substrate 10 is processed in accordance with the flowchart shown in FIG. 1a by using the manufacturing apparatus 300 as described above.

The substrate 10 loaded into the vacuum transfer chamber 390 is sequentially transferred to the first sputtering chamber 311, second sputtering chamber 321, and third sputtering chamber 331, thereby sequentially stacking the PtMn layer 33 as an antiferromagnetic layer, the magnetization fixed layer 34 (Pinned Layer, Ru, Pinned Layer), the insulating layer 35 (Barrier Layer), the free layer 36, and the protective layer 37 (hard mask) on the Ta layer 32 as an underlying layer.

Figure 4:
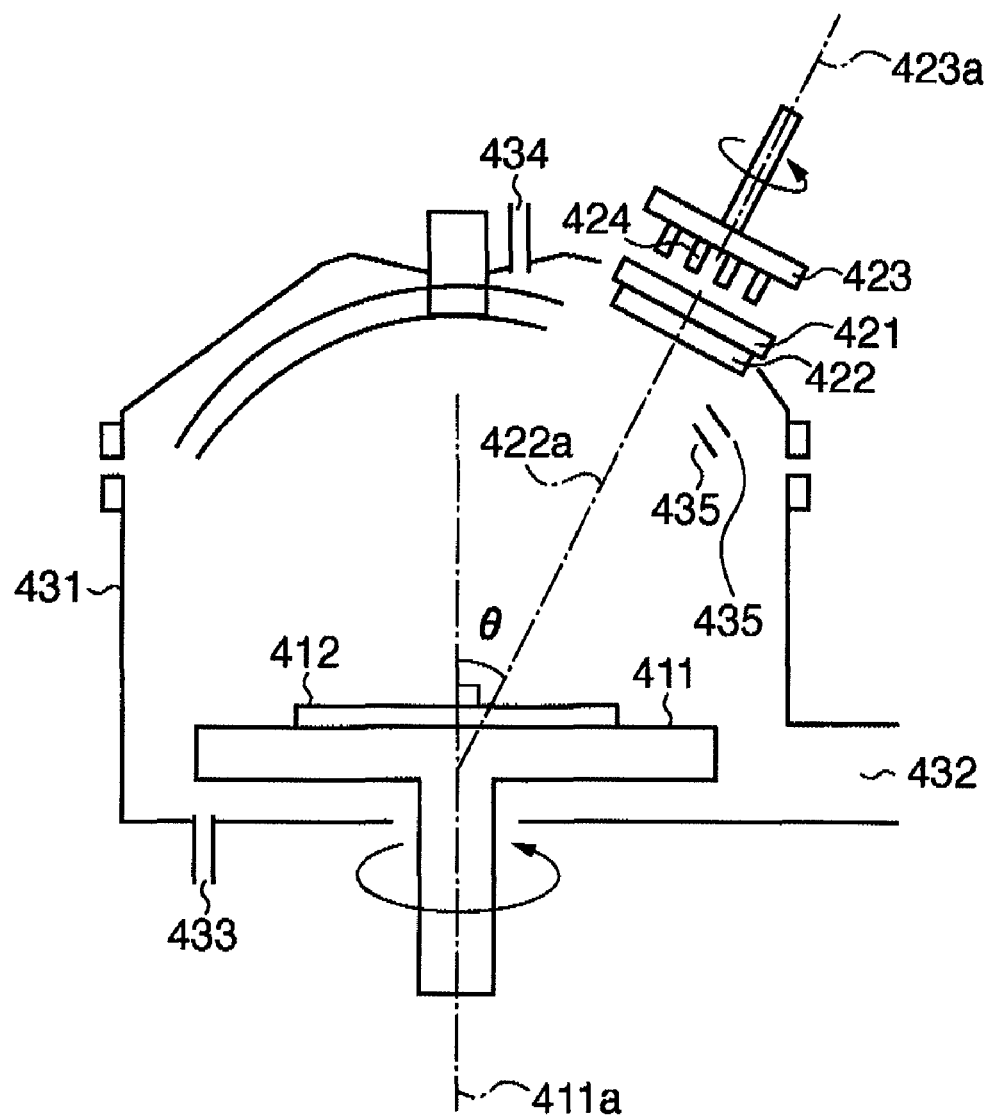
FIG. 4 is a view showing an outline of the arrangement of an example of a sputtering chamber of the magnetoresistive effect element manufacturing apparatus according to the present invention.

The structure of the sputtering chamber of the present invention will be explained below with reference to FIG. 4. In this sputtering chamber, a substrate 412 can be placed on a substrate holder 411. While a film is deposited on the substrate 412, a servo motor (not shown) installed outside the sputtering chamber rotates the substrate holder 411 via a rotation transmitting mechanism (not shown). A film having a high film thickness uniformity can be formed by rotating the substrate 412. A target 422 is attached to a target cathode 421.

Also, an evacuating means (not shown) evacuates a chamber 431 through an evacuation port 432.

Gas supply systems 433 and 434 can supply desired processing gases to the sputtering chamber. A diaphragm vacuum meter or the like monitors the internal pressure of the sputtering chamber in which processing is performed, through a port (not shown) capable of measuring the interior.

The target 422 is set obliquely to the substrate 412, which is placed on the substrate holder 411; the substrate holder 411 is designed such that a plurality of targets can simultaneously be mounted, and in this embodiment, five target cathodes are mounted. An axis 411a of the substrate holder 411 and an axis 422a of the target 422 intersect each other at a predetermined angle $\theta$, and exist in the same plane. The angle $\theta$ between the two axes 411a and 422a is preferably set at $5° \leq \theta \leq 45°$.

The sputtering cathode 421 and target 422 are electrically insulated from the sputtering chamber 431 and other portions by an insulator (not shown).

A magnet array 424 of permanent magnets fixed to a rotatable support plate 423 exists above or beside the target 422 and target cathode 421. The support plate 423 has a driving mechanism (not shown). While the apparatus is in operation, the magnet array 424 is rotated around a support plate rotating shaft 423a by a servo motor included in the driving mechanism.

A double shutter 435 is used to maintain the film formation performance in the formation of a very thin film. Especially when using a plurality of targets, the double shutter 435 is important to prevent cross contamination.

A DC power supply (not shown) supplies DC power for generating a plasma to the target 422 described above. Note that the use of DC power is not essential. It is also possible to generate a plasma by using RF (AC) power instead of DC power.

Then, the substrate 10 is transferred to the annealing chamber 341, and an annealing process is performed. The annealing temperature is, for example, about 300° C., and the annealing process is performed for, for example, for 4 hrs. This gives the desired magnetization to the PtMn layer 33.

Subsequently, the substrate 10 is transferred to the first reactive ion etching chamber 351, and the hard mask layer 3 is etched by using a photoresist layer 4 formed on the surface of the multilayered magnetic film 1 of the substrate 10 as a PR mask 5 (step 101).

The substrate 10 is then transferred from the first reactive ion etching chamber 351 to the second reactive ion etching chamber 361 while maintaining the vacuum state. In the second reactive ion etching chamber 361, the multilayered magnetic film 1 is etched, that is, the multilayered magnetic film 1 is micropatterned by using the hard mask layer 3 as a mask by reactive ion etching using alcohol having at least one hydroxyl group such as methanol as an etching gas (step 102).

In this reactive ion etching, etching can be performed on the PtMn layer 33 as an antiferromagnetic layer on the Ta layer 32 through the insulating layer 35 of the multilayered magnetic film 1 exemplarily shown in FIG. 2. It is also possible to etch the free layer 36 and stop etching at the insulating layer 35, as one manufacturing step of an MRAM. This reactive ion etching step (step 102) can be adopted in any step.

The use of alcohol having at least one hydroxyl group as an etching gas makes it possible to obtain the effects of increasing the etching rate and reducing a damaged layer (a layer mainly deteriorated by oxidation), compared to the conventional method using carbon monoxide gas to which ammonia gas is added. For example, when using alcohol having at least one hydroxyl group as an etching gas, the thickness of a layer deteriorated by oxidation can be decreased to about a few ten Å.

As shown in the third view from above in FIG. 1b, the processing in the second reactive ion etching chamber 361 forms a damaged layer 6 as a layer mainly damaged by oxidation on the sidewalls and upper surface of the multilayered magnetic film 1, or on the sidewalls and upper surface of the multilayered magnetic film 1 and the sidewalls and upper surface of the hard mask layer 3 partially remaining on the upper surface of the multilayered magnetic film 1.

Subsequently, the substrate 10 processed in the second reactive ion etching chamber 361 is transferred to the radical processing chamber 371 while maintaining the vacuum state. A process of reducing the damaged layer 6 is performed in the radical processing chamber 371 (step 103).

The radical processing chamber 371 is a processing chamber for reducing the damaged layer 6 by generating a plasma at an ion current density of $4 \times 10^{-7}$ A/cm$^2$ or less by using a gas such as hydrogen or ammonia.

Figure 5:
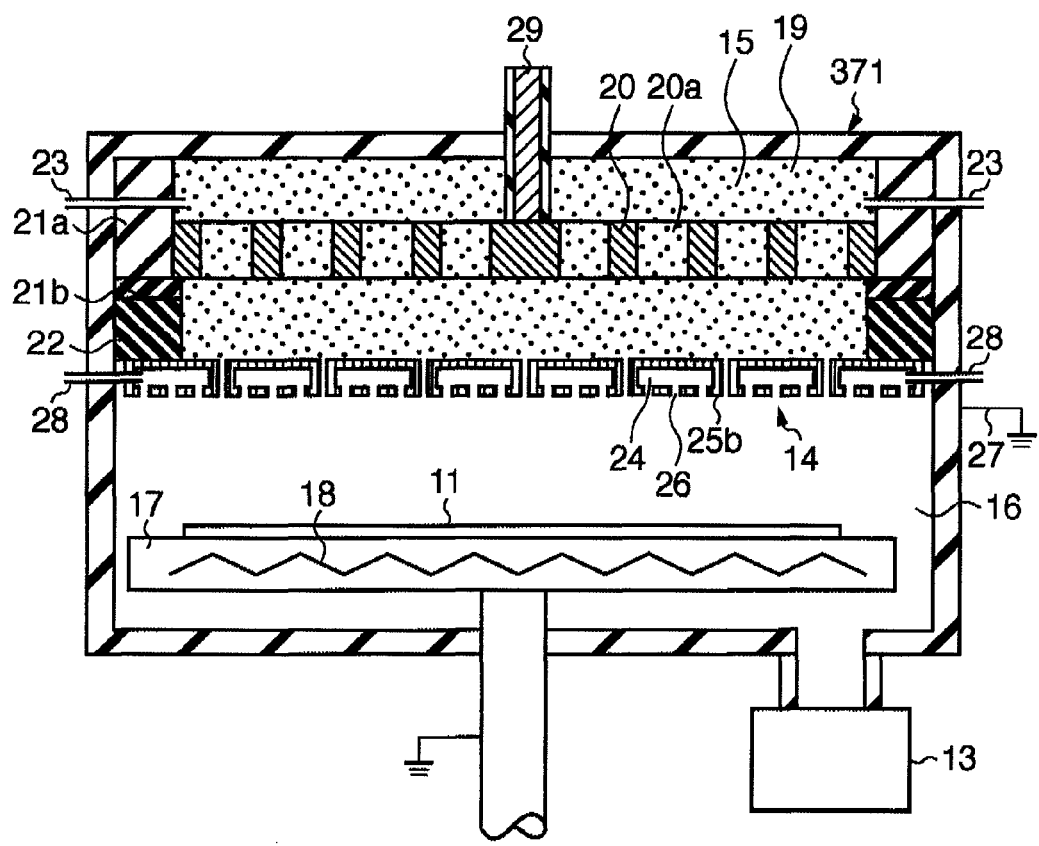
FIG. 5 is a sectional view showing an outline of the arrangement of an example of a radical processing chamber of the magnetoresistive effect element manufacturing apparatus according to the present invention.

FIG. 5 is a sectional view showing the arrangement of the radical processing chamber 371 (see FIG. 3) of the magnetoresistive effect element manufacturing apparatus, as an example of the means for exposing the multilayered magnetic film to a plasma at an ion current density of $4 \times 10^{-7}$ A/cm$^2$ or less according to the present invention.

As shown in FIG. 5, the radical processing chamber 371 has a vacuum vessel allowed to communicate with the vacuum transfer chamber 390 (see FIG. 3) without breaking the vacuum. The radical processing chamber 371 can be evacuated to a low pressure and held in a predetermined vacuum state by an evacuating mechanism 13. Also, a partition plate 14 made of a conductive material (e.g., SUS or aluminum) is horizontally set in the radical processing chamber 371. The partition plate 14 is set such that its periphery is pushed against the lower surface of a conductive fixing member 22, thereby forming a closed state. The partition plate 14 is set at a ground potential 27 via the conductive fixing member 22.

The partition plate 14 partitions the interior of the radical processing chamber 371 into upper and lower spaces. A plasma discharge space 15 is formed in the upper space, and a substrate processing space 16 is formed in the lower space. A high-frequency electrode 20 is installed in the plasma discharge space 15, and a substrate holding mechanism 17 is installed in the substrate processing space 16.

Processing gas supply spaces 24 are formed inside the partition plate 14. The processing gas supply spaces 24 are partitioned from the plasma discharge space 15, and communicate with the substrate processing space 16 through a plurality of processing gas diffusion holes 26.

The processing gas supply spaces 24 formed inside the partition plate 14 are spaces for evenly supplying a processing gas, for example, silane gas for film formation externally supplied to the partition plate 14 into the substrate processing space 16 by dispersing the gas. Processing gas supply pipes 28 for externally supplying the film formation gas such as silane gas are connected sideways to the processing gas supply spaces 24.

Also, a plurality of partition plate through holes 25b are formed to vertically extend through those portions of the partition plate 14, in which the processing gas supply spaces 24 do not exist.

That is, the interior of the radical processing chamber 371 is partitioned into the plasma discharge space 15 and substrate processing space 16 by the partition plate 14, but the plasma discharge space 15 and substrate processing space 16 communicate with each other through only the plurality of partition plate through holes 25b.

The potential of the substrate holding mechanism 17 is held at the ground potential 27 that is the same potential as that of the radical processing chamber 371. In addition, a heater 18 is formed inside the substrate holding mechanism 17. The heater 18 can hold the substrate 10 at a predetermined temperature.

Plasma generation gas supply pipes 23 for externally supplying a plasma generation gas such as hydrogen or ammonia to the plasma discharge space 15 are connected to an insulating member 21a.

The plasma generation gas supply pipes 23 are connected to plasma generation gas supply sources via mass flow controllers (not shown) for controlling the flow rate.

A method of performing radical processing by using the radical processing chamber configured as described above will be explained below.

The substrate 10 is loaded into the radical processing chamber 371, and placed on the substrate holding mechanism 17. The radical processing chamber 371 is evacuated to a low pressure and held in a predetermined vacuum state by the evacuating mechanism 13. Then, ammonia gas is supplied to the plasma discharge space 15 through the plasma generation gas supply pipes 23.

When high-frequency electric power is supplied to the high-frequency electrode 20 via a power supply rod 29 in the above state, discharge occurs and generates a plasma 19 in the plasma discharge space 15. At the same time, a nitrogen radical (excited active species) as a neutral excited species is generated.

The generated nitrogen radical is supplied, through the partition plate through holes 25b, to the substrate processing space 16 in which the substrate 10 is set. Consequently, the radical processing can be performed on the substrate 10 without exposing it to the plasma 19.

The radical processing chamber 371 shown in FIG. 5 has been explained as the means for exposing the multilayered magnetic film 1 to the radical. As described previously, however, the radical processing chamber 371 can also be used as the means for forming a film by using, for example, silane gas as the film formation gas, and supplying silane gas to the processing gas supply spaces 24 through the processing gas supply pipes 28.

That is, silane gas supplied to the processing gas supply spaces 24 is directly supplied to the substrate processing space 16 through the processing gas diffusion holes 26 without being brought into contact with the radical or plasma.

Silane gas thus supplied into the substrate processing space 16 causes a chemical reaction with the nitrogen radical of nitrogen gas supplied into the substrate processing space 16 through the partition plate through holes 25b, thereby forming a silicon nitride film on the surface of the substrate 10.

As described above, a protective film 7 can be selected from, for example, aluminum nitride formed by high-frequency, high-pressure sputtering and a silicon nitride film formed by CVD, in accordance with the application.

Figure 6:
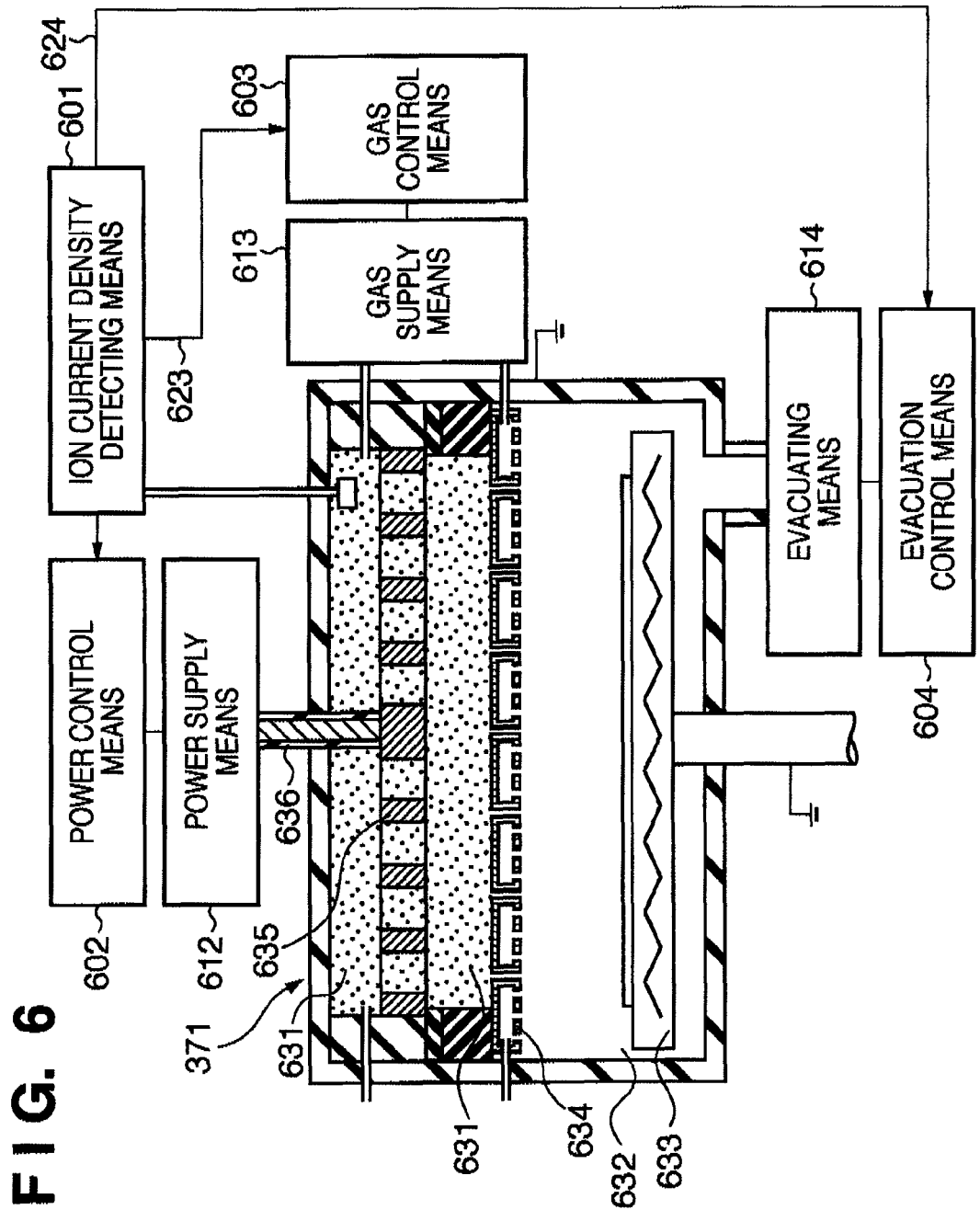
FIG. 6 is a block diagram of a control means of the magnetoresistive effect element manufacturing apparatus according to the present invention.

Control of the radical processing chamber 371 will be explained below with reference to FIG. 6. FIG. 6 is a block diagram showing an example of a control means for controlling the ion current density to $4 \times 10^{-7}$ A/cm$^2$ or less according to the present invention.

As shown in FIG. 6, an ion current density detecting means 601 is installed in a second sub space 631, and capable of detecting the ion current density in the second sub space 631. The ion current density detecting means 601 notifies a power control means 602, gas control means 603, and evacuation control means 604 of the numerical value of the detected ion current density, and feedback control is performed such that the ion current density in the second sub space 631 is $4 \times 10^{-7}$ A/cm$^2$ or less.

As described above, the damaged layer 6 is sometimes formed in the radical processing chamber 371 even by the processing performed by reactive ion etching that uses alcohol having at least one hydroxyl group and causes little damage. Therefore, the thin damaged layer 6 is reduced, without changing its shape, by exposing it to a plasma at an ion current density of $4 \times 10^{-7}$ A/cm$^2$ or less, thereby obtaining a higher-quality multilayered magnetic film.

The damaged layer 6 formed by the processing performed in the second reactive ion etching chamber 361 by reactive ion etching using alcohol having at least one hydroxyl group as an etching gas has a thickness of at most about a few ten Å. This makes it possible to shorten the time of processing for reducing the damaged layer performed by a radical in the radical processing chamber 371 subsequently to the reactive ion etching. In addition, the processing decreases neither the throughput as the production amount per unit time nor the production efficiency.

That is, the damaged layer 6 formed by the reactive ion etching in the second reactive ion etching chamber 361 is thinner than a damaged layer formed by the conventional reactive ion etching using carbon monoxide gas to which ammonia gas is added. Accordingly, the damaged layer can be reduced by exposing it to a radical after that within the reactive ion etching processing time that determines the production efficiency of the manufacturing apparatus. Therefore, the magnetoresistive effect element manufacturing method and manufacturing apparatus 300 of the present invention decrease neither the throughput as the production amount per unit time nor the production efficiency.

The radical processing chamber 371 is not limited to the embodiment shown in FIG. 5, for example, the radical generation method is not limited. For example, it is also possible to adopt a radical generation method using a heater such as a thermal filament.

The substrate 10 from which the damaged layer 6 is removed is transferred to the film formation chamber 381 while maintaining the vacuum state, and the protective film 7 is formed (step 104).

The multilayered magnetic film 1 from which the damaged layer 6 is reduced can be kept clean by covering the multilayered magnetic film 1 with the protective film 7.

The film formation chamber 381 can be a sputtering chamber in which a high-frequency, high-pressure sputtering is performed. For example, the protective film 7 can be formed in step 104 by a high-frequency, high-pressure sputtering method performed under high-frequency, high-pressure conditions, that is, in a high-frequency region of 1 KHz (inclusive) to 100 MHz (inclusive), and in a vacuum degree region at a high pressure of 1 Pa (inclusive) to 20 Pa (inclusive).

The protective film 7 can be, for example, an aluminum nitride (AlN) film.

Figure 8:
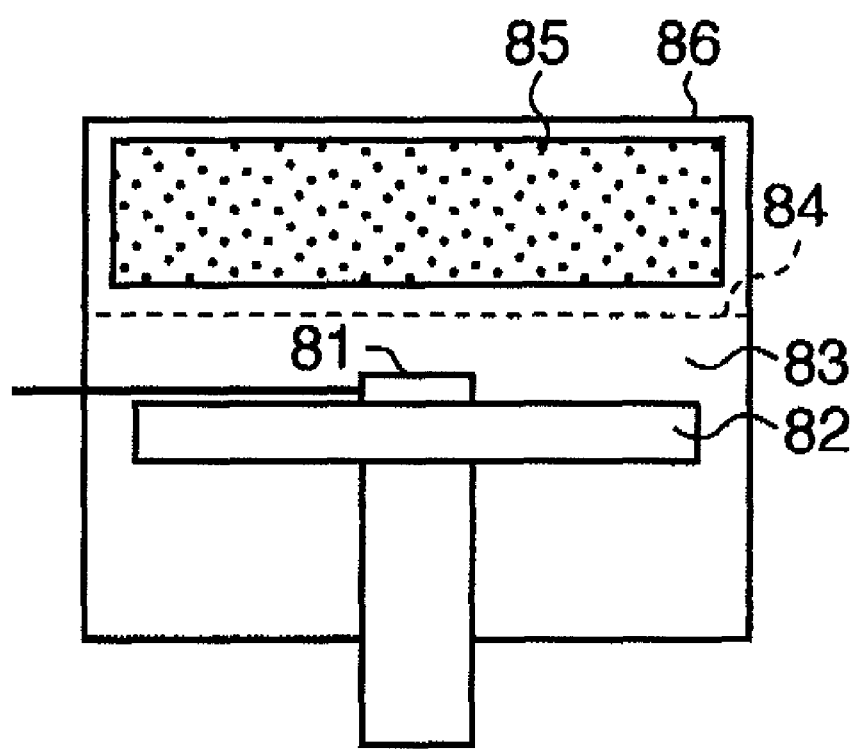
FIG. 8 is an exemplary view for explaining the radical processing chamber.
Figure 9:
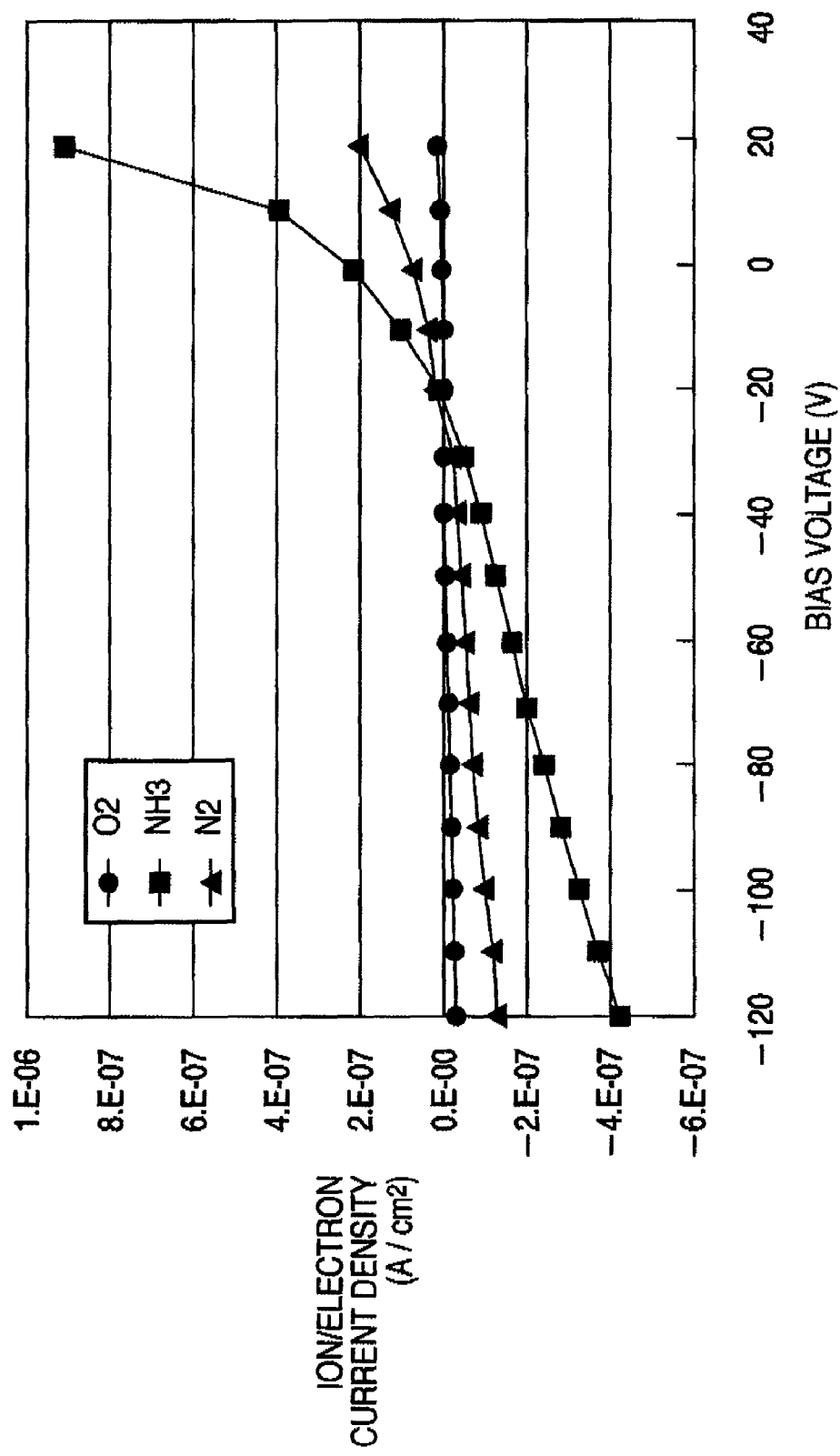
FIG. 9 is a graph showing the measurement results of the ion current density when a bias voltage to be applied to a substrate holding mechanism is changed.

An ion current density measurement method will now be explained. FIG. 8 is an exemplary view of the radical processing chamber. Referring to FIG. 8, a Langmuir probe 81 is installed in a position on a substrate holding mechanism 82 where a substrate is to be placed. A plasma generating means (not shown) generates a plasma 85 in a plasma space 86, and the Langmuir probe 81 measures the ion current density of the plasma having passed through a partition plate 84 and reached the position on the substrate holding mechanism 82 where a substrate is to be placed in a substrate processing space 83. By using this measurement method, the ion current density was measured for each of $O_2$, $NH_3$, and $N_2$ gases while changing a bias voltage to be applied to the substrate holding mechanism. FIG. 9 shows the results. Referring to FIG. 9, the ordinate indicates the ion current density/electron current density; the + side indicates an electron current, and the − side indicates an ion current. FIG. 9 reveals that the electron current density increases when the bias voltage increases, and abruptly increases when the bias voltage is 10 V or more. That is, when the bias voltage is +10 V or more, a high-density plasma leaks to the vicinity of a substrate, and ion bombardment or the like inflicts damage to the substrate. By contrast, an ion current is generated when the bias voltage is negative, but the ion current density is very low, that is, on the order of $10^{-7}$ A/cm² until the bias voltage is about −100 V. Note that the ion current density is not determined by the bias voltage alone, but determined by various factors such as the gas species, gas flow rate, pressure, and input power. Since the ion current density determines the damage to a substrate, it is important to make the ion current density to which a substrate is to be exposed lower than a predetermined value. The present inventors made extensive studies, and obtained the findings that when using a plasma at an ion current density of $4 \times 10^{-7}$ A/cm² or less, damage to the surface of the processed multilayered magnetic film is small even if the substrate surface is processed using reactive ion etching or the like, thereby reaching the present invention.

An example in which a magnetoresistive effect element is manufactured in the steps shown in FIGS. 1a and 1b by using the magnetoresistive effect element manufacturing apparatus 300 according to the present invention having the arrangement shown in FIG. 3 will be explained below.

(1) Step 101: Etching of Hard Mask Layer 3 Performed Using Photoresist Layer 4 as PR Mask 5

In the first reactive ion etching chamber 351 of a reactive ion etching apparatus, for example, an etching apparatus incorporating an ICP (Inductive Coupled Plasma) plasma source, the hard mask layer 3 is etched by using the photoresist layer 4 as the PR mask 5 under the following conditions.

| | |
|---|---|
| Etching gas | $CF_4$ |
| Etching gas flow rate | 326 mg/min |
| | (50 sccm) |
| Hard mask layer 3 | Ta layer |
| Source power | 500 W |
| Bias power | 70 W |
| Internal pressure of first reactive ion etching chamber 42 | 0.8 Pa |
| Temperature of substrate holder holding substrate 10 | 80° C. |

(2) Step 102: Etching of Multilayered Magnetic Film 1 Performed Using Hard Mask Layer 3 as Mask In the second reactive ion etching chamber 361 of a reactive ion etching apparatus similar to that used in the process of step 101, for example, an etching apparatus incorporating an ICP (Inductive Coupled Plasma) plasma source, the multilayered magnetic film 1 is etched by using the hard mask layer (Ta layer) 3 as a mask under the following conditions.

| | |
|---|---|
| Etching gas | $CH_3OH$ gas |
| Etching gas flow rate | 18.756 mg/min |
| | (15 sccm) |
| Source power | 1,000 W |
| Bias power | 800 W |
| Internal pressure of second reactive ion etching chamber 43 | 0.4 Pa |
| Temperature of substrate holder holding substrate 10 | 40° C. |
| Etching time | 3 min |

(3) Step 103: Reduction of Damaged Layer 6 by Radical Processing

In the radical processing chamber 371, the damaged layer 6 is reduced as it is exposed to a plasma at an ion current density of $4 \times 10^{-7}$ A/cm² or less under the following conditions.

| | |
|---|---|
| High-frequency power | 700 W |
| Internal pressure of substrate processing Space | 15 (Pa) |
| Substrate temperature | 300° C. |
| Radical processing time | 3 min |

The MR ratio (Magnetoro Resistance ratio = $(R_{max} - R_{min})/R_{min}$) of the magnetoresistive effect element processed as described above was compared with that of a magnetoresistive effect element for which only the processes in steps 101 and 102 were performed under the same conditions as above, and the process in step 103 was not performed.

The comparison result shows that the MR ratio of the magnetoresistive effect element processed by the steps of the present invention was higher by 7% to 10% than that of the magnetoresistive effect element in which the damaged layer 6 was not reduced by radical processing.

The processing time of reactive ion etching determines the number of substrates 10 to be processed per unit time (throughput). That is, even when the radical processing step is added, the radical processing is completed within the reactive ion etching processing time. Therefore, the throughput does not decrease, and the yield can be increased by the improvement of the magnetic characteristic (MR ratio). This makes it possible to increase the production efficiency.

(4) Step 104: Formation of Protective Film 7

In the film formation chamber 381 of the manufacturing apparatus, an aluminum nitride (AlN) film is formed as the protective film 7 by a 13.56-MHz, high-frequency, high-pressure sputtering method (Al target) under the following conditions, thereby covering, with the protective film 7, the multilayered magnetic film 1 from which the damaged layer 6 is reduced.

|   |   |
|---|---|
| Sputtering gas | Ar gas + $N_2$ gas |
| Internal pressure of film formation chamber 45 | 8 Pa |
| Temperature of substrate holder holding substrate 10 | 200° C. |

Since the film formation chamber 381 is connected while maintaining the vacuum state and the protective film is formed in the film formation chamber 381 as described above, the damaged layer is reduced as it is exposed to a plasma at an ion current density of $4\times10^{-7}$ A/cm$^2$ or less, and subsequently the multilayered magnetic film is covered with the protective film. Therefore, the multilayered magnetic film can be kept clean.

The preferred embodiment of the present invention has been explained above with reference to the accompanying drawings. However, the present invention is not limited to this embodiment, and can be changed into various forms within the technical scope grasped from the description of the scope of claims.

Figure 7:
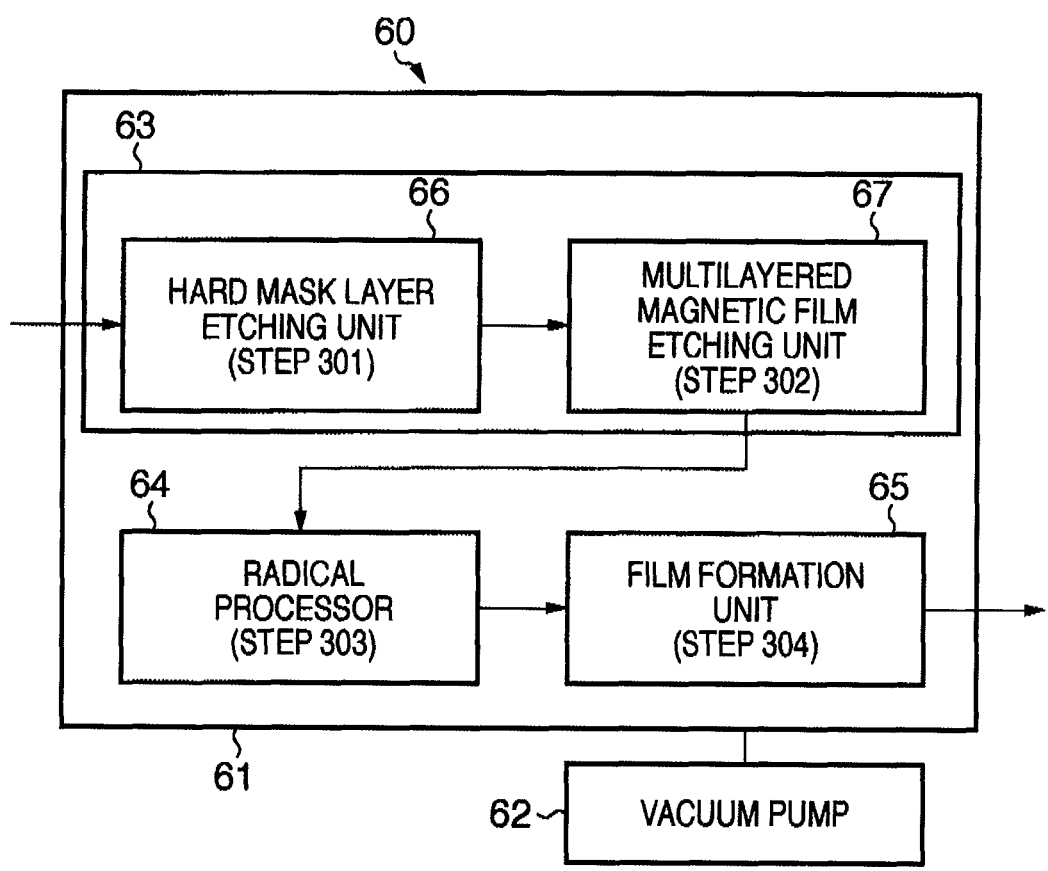
FIG. 7 is a block diagram for explaining an outline of another arrangement of the magnetoresistive effect element manufacturing apparatus according to the present invention.

For example, it is also possible to use an in-line type manufacturing apparatus as shown in FIG. 7 as the magnetoresistive effect element manufacturing apparatus of the present invention, and perform the magnetoresistive effect element manufacturing method of the present invention in this in-line type manufacturing apparatus.

That is, a magnetoresistive effect element manufacturing apparatus in which a means for etching a multilayered magnetic film forming a magnetoresistive effect element by reactive ion etching and a means for exposing the multilayered magnetic film etched by this reactive ion etching means to a plasma at an ion current density of $4\times10^{-7}$ A/cm$^2$ or less are installed in a vacuum chamber held in a vacuum is prepared.

For example, a reactive ion etching method can be used as the means for etching the multilayered magnetic film forming the magnetoresistive effect element by reactive ion etching, and a method of performing radical processing can be used as the means for applying a radical. Also, before the means for etching the multilayered magnetic film forming the magnetoresistive effect element by reactive ion etching, a means for etching the hard mask layer by reactive ion etching by using the photoresist layer of the multilayered magnetic film as the PR mask can be further installed in the vacuum chamber held in a vacuum.

In addition, a means for forming a thin film, that is, a protective film on the multilayered magnetic film having undergone the radical processing by the means for exposing the multilayered magnetic film to a plasma at an ion current density of $4\times10^{-7}$ A/cm$^2$ or less can be further installed in the vacuum chamber held in a vacuum.

An example of the method of manufacturing the magnetoresistive effect element according to the present invention by using the in-line type manufacturing apparatus as described above will be explained below with reference to FIG. 7. A substrate is loaded into the magnetoresistive effect element manufacturing apparatus.

Etching processes are performed by the reactive ion etching means including the hard mask layer etching means and multilayered magnetic film etching means. For example, the hard mask layer is first etched by the etching means for etching the hard mask layer by reactive ion etching by using the photoresist layer of the multilayered magnetic film as the PR mask (step 301).

Then, the multilayered magnetic film forming the magnetoresistive effect element is etched by the means for etching the multilayered magnetic film by reactive ion etching (step 302).

The damaged layer formed by the processing performed by the reactive ion etching means is reduced by the means for exposing the damaged layer to a plasma at an ion current density of $4\times10^{-7}$ A/cm$^2$ or less (step S303).

Subsequently, the film forming means for forming the protective film covers the multilayered magnetic film having the improved damaged layer with the protective film (step 304), and the substrate is unloaded as it is kept clean.

These steps are performed by the vacuum chamber and vacuum pump forming the vacuum holding means while maintaining a vacuum state.

Even when using the in-line type manufacturing apparatus as described above, a high-quality magnetoresistive effect element can be manufactured by performing the magnetoresistive effect element manufacturing method of the present invention, because the damaged layer of the multilayered magnetic film, which is inevitably formed by reactive ion etching, is reduced by the radical processing. It is also possible to increase the production efficiency because the yield can be increased by improving the magnetic characteristics.

The present invention is not limited to the above embodiment and various changes and modifications can be made without departing from the spirit and scope of the invention. Therefore, to apprise the public of the scope of the present invention, the following claims are appended.

This application claims the benefit of Japanese Patent Application No. 2006-248518, filed Sep. 13, 2006, which is hereby incorporated by reference herein in its entirety.

The invention claimed is:

1. A magnetoresistive effect element manufacturing method comprising:
    a first step of preparing a magnetoresistive effect element including a magnetic film and a substrate;
    a second step of etching a predetermined region of the magnetic film by a reactive ion etching method in the presence of a hydrogen atom and an oxygen atom activated by a plasma; and
    a third step of exposing the magnetic film having undergone the second step to a plasma at an ion current density of not more than $4\times10^{-7}$ A/cm$^2$,
    wherein the third step comprises
    a plasma formation step of forming a plasma by supplying a reducing gas,
    a removal step of removing ions and electrons from the plasma formed in the plasma formation step by passing the plasma through a first member having a plurality of through holes, wherein the first member is set at a ground potential, and
    an exposure step of exposing the magnetic film to a plasma which is adjusted to the ion current density through the removal step and mainly contains a radical, thereby reducing the oxygen atom coupled to the magnetic film.

2. The magnetoresistive effect element manufacturing method according to claim 1, wherein the magnetoresistive effect element is an element including an antiferromagnetic layer, a magnetization fixed layer, an insulating layer, and a free layer.

3. The magnetoresistive effect element manufacturing method according to claim 1, wherein the reactive ion etching method uses, as an etching gas, at least one type of a compound selected from the compound group consisting of alcohols, ketones, carboxylic acids, aldehydes, esters, and ethers.

4. The magnetoresistive effect element manufacturing method according to claim 1, wherein the reactive ion etching method uses hydrocarbons and an oxygen containing compound as an etching gas.

5. The magnetoresistive effect element manufacturing method according to claim 1, wherein the reactive ion etching method further has a step of adding one of a nitrogen atom and a carbon atom activated by a plasma.

6. The magnetoresistive effect element manufacturing method according to claim 1, wherein the reducing gas is at least one type of a gas selected from the gas group consisting of hydrogen gas and ammonia gas.

7. The magnetoresistive effect element manufacturing method according to claim 1, wherein in the second step and the third step, all steps from the second step and the third step are performed without being exposed to the air.

* * * * *